United States Patent
Krietzman et al.

(10) Patent No.: US 9,560,777 B2
(45) Date of Patent: Jan. 31, 2017

(54) DOOR CLOSER MECHANISM FOR HOT/COLD AISLE AIR CONTAINMENT ROOM

(71) Applicant: CHATSWORTH PRODUCTS, INC., Westlake Village, CA (US)

(72) Inventors: William Krietzman, Castle Rock, CO (US); Richard Evans Lewis, II, Austin, TX (US)

(73) Assignee: Chatsworth Products, Inc., Westlake Village, CA (US)

( * ) Notice: Subject to any disclaimer, the term of this patent is extended or adjusted under 35 U.S.C. 154(b) by 1026 days.

(21) Appl. No.: 13/763,708

(22) Filed: Feb. 10, 2013

(65) Prior Publication Data

US 2013/0210335 A1 Aug. 15, 2013

Related U.S. Application Data

(60) Provisional application No. 61/597,301, filed on Feb. 10, 2012.

(51) Int. Cl.
*H05K 5/00* (2006.01)
*H05K 5/02* (2006.01)
(Continued)

(52) U.S. Cl.
CPC .......... *H05K 5/0213* (2013.01); *H05K 7/1497* (2013.01); *H05K 7/20745* (2013.01)

(58) Field of Classification Search
CPC . H05K 5/0213; H05K 7/1497; H05K 7/20745
(Continued)

(56) References Cited

U.S. PATENT DOCUMENTS

| 2,424,217 A | 7/1947 | Bales |
| 2,766,861 A | 10/1956 | Abramson |

(Continued)

FOREIGN PATENT DOCUMENTS

| AU | 2008254682 | 11/2012 |
| EP | 2205054 A1 | 7/2010 |

(Continued)

OTHER PUBLICATIONS

Information Disclosure Statement (IDS) Letter Regarding Common Patent Application(s), dated Jan. 20, 2015.

(Continued)

*Primary Examiner* — Steven B McAllister
*Assistant Examiner* — Jonathan Cotov
(74) *Attorney, Agent, or Firm* — Tillman Wright, PLLC; James D. Wright; David R. Higgins

(57) ABSTRACT

A hot/cold aisle air containment room includes a plurality of electronic equipment enclosures at least partially defining an interior aisle, a frame structure supporting one or more ceiling panels above the interior aisle, and a door assembly. The door assembly includes a sliding door and an unpowered door closer mechanism adapted to move the sliding door from an open state to a closed state, thereby providing controlled access to the interior aisle and minimizing intermixing of hot air and cold air between an environment external to the hot/cold aisle air containment room and an environment internal to the hot/cold aisle air containment room.

20 Claims, 13 Drawing Sheets

(51) Int. Cl.
    *H05K 7/20*           (2006.01)
    *H05K 7/14*           (2006.01)

(58) Field of Classification Search
    USPC .......................................................... 454/184
    See application file for complete search history.

(56) References Cited

U.S. PATENT DOCUMENTS

| | | | |
|---|---|---|---|
| 3,034,844 A | 5/1962 | Anderson et al. | |
| 3,374,821 A | 3/1968 | White | |
| 3,889,419 A | 6/1975 | Maleck | |
| 4,004,372 A * | 1/1977 | Beard | E05F 1/16 16/72 |
| 4,235,494 A * | 11/1980 | Chu | E06B 3/921 160/25 |
| 4,330,960 A * | 5/1982 | Hasemann | E05F 3/222 16/78 |
| 4,372,005 A * | 2/1983 | Inesso | E05F 3/108 16/52 |
| 4,495,234 A | 1/1985 | Tominaga et al. | |
| 4,502,609 A | 3/1985 | Christatos | |
| 4,620,392 A | 11/1986 | Kerpers et al. | |
| 4,757,642 A * | 7/1988 | Hahn | E05F 1/16 16/77 |
| 4,901,202 A | 2/1990 | Leschinger | |
| 5,187,836 A | 2/1993 | Kim et al. | |
| 5,294,748 A | 3/1994 | Schwenk et al. | |
| 5,488,543 A | 1/1996 | Mazura et al. | |
| 5,829,197 A | 11/1998 | Oh | |
| 5,848,500 A | 12/1998 | Kirk | |
| 5,957,506 A | 9/1999 | Stepp | |
| 5,997,117 A | 12/1999 | Krietzman | |
| 6,006,925 A | 12/1999 | Sevier | |
| 6,044,193 A | 3/2000 | Szetesi et al. | |
| 6,065,612 A | 5/2000 | Rinderer | |
| 6,079,162 A * | 6/2000 | Hein | E05F 15/72 49/1 |
| 6,123,400 A | 9/2000 | Nicolai et al. | |
| 6,225,904 B1 * | 5/2001 | Jaffe | F25D 23/021 340/545.3 |
| 6,348,655 B1 | 2/2002 | Wright | |
| 6,373,721 B2 | 4/2002 | Lecinski et al. | |
| 6,425,488 B1 | 7/2002 | Notohardjono et al. | |
| 6,425,648 B1 | 7/2002 | Notohardjono et al. | |
| 6,481,160 B1 * | 11/2002 | Kowalczyk | E05F 3/224 49/333 |
| 6,515,225 B1 | 2/2003 | Wright | |
| 6,517,174 B2 | 2/2003 | Sevier | |
| 6,527,351 B1 | 3/2003 | Sevier et al. | |
| 6,561,602 B1 | 5/2003 | Sevier et al. | |
| 6,613,981 B1 | 9/2003 | Hathcock et al. | |
| 6,691,465 B1 * | 2/2004 | Stephan | E05F 1/16 16/72 |
| 6,695,149 B1 | 2/2004 | Cote et al. | |
| 6,712,434 B2 | 3/2004 | Knab et al. | |
| 6,755,493 B1 | 6/2004 | Krietzman et al. | |
| 6,762,360 B2 | 7/2004 | Wright | |
| 6,788,535 B2 | 9/2004 | Dodgen et al. | |
| 6,802,154 B1 * | 10/2004 | Holt | E05F 15/646 49/139 |
| 6,814,244 B1 | 11/2004 | Hathcock | |
| 6,859,366 B2 * | 2/2005 | Fink | E04H 5/02 165/121 |
| 6,945,616 B2 | 9/2005 | Webster et al. | |
| 6,980,433 B2 | 12/2005 | Fink | |
| 7,046,514 B2 * | 5/2006 | Fink | H05K 7/20 165/121 |
| 7,074,123 B2 * | 7/2006 | Bettridge | H05K 7/20736 312/236 |
| 7,142,765 B2 | 11/2006 | Rapp et al. | |
| 7,144,320 B2 | 12/2006 | Turek et al. | |
| 7,145,772 B2 | 12/2006 | Fink | |
| 7,173,820 B2 | 2/2007 | Fink et al. | |
| 7,178,292 B2 | 2/2007 | Yamada | |
| 7,226,353 B2 | 6/2007 | Bettridge et al. | |
| 7,255,640 B2 | 8/2007 | Aldag et al. | |
| 7,259,963 B2 | 8/2007 | Germagian et al. | |
| 7,268,998 B2 | 9/2007 | Ewing et al. | |
| 7,278,273 B1 * | 10/2007 | Whitted | H05K 7/1497 361/690 |
| 7,293,666 B2 | 11/2007 | Mattlin et al. | |
| 7,312,980 B2 | 12/2007 | Ewing et al. | |
| 7,425,678 B2 | 9/2008 | Adducci et al. | |
| 7,427,713 B2 | 9/2008 | Adducci et al. | |
| 7,472,970 B2 | 1/2009 | Bergesch et al. | |
| 7,476,804 B2 | 1/2009 | Adducci et al. | |
| 7,485,803 B2 | 2/2009 | Adducci et al. | |
| 7,495,169 B2 | 2/2009 | Adducci et al. | |
| 7,498,512 B2 | 3/2009 | Adducci et al. | |
| 7,504,581 B2 | 3/2009 | Adducci et al. | |
| 7,506,768 B2 | 3/2009 | Rassmussen et al. | |
| 7,529,086 B2 | 5/2009 | Fink et al. | |
| 7,542,287 B2 | 6/2009 | Lewis, II et al. | |
| 7,643,291 B2 | 1/2010 | Mallia et al. | |
| 7,656,660 B2 * | 2/2010 | Hoeft | H05K 7/20745 181/200 |
| 7,684,193 B2 | 3/2010 | Fink et al. | |
| 7,697,285 B2 | 4/2010 | Donowho et al. | |
| 7,718,891 B2 | 5/2010 | Adducci et al. | |
| 7,746,637 B2 | 6/2010 | Donowho et al. | |
| 7,772,489 B2 | 8/2010 | Adducci et al. | |
| 7,795,532 B2 | 9/2010 | Walker | |
| 7,804,685 B2 | 9/2010 | Krietzman | |
| 7,816,602 B2 | 10/2010 | Landry et al. | |
| 7,824,814 B2 | 11/2010 | Suzuki et al. | |
| 7,839,635 B2 | 11/2010 | Donowho et al. | |
| 7,878,888 B2 | 2/2011 | Rasmussen et al. | |
| 7,880,084 B2 | 2/2011 | Adducci et al. | |
| 7,881,057 B2 | 2/2011 | Fink et al. | |
| 7,894,190 B2 | 2/2011 | Davis et al. | |
| 7,895,855 B2 | 3/2011 | Gooch | |
| 7,952,869 B2 | 5/2011 | Lewis, II et al. | |
| 7,957,139 B2 | 6/2011 | Davis et al. | |
| 7,974,105 B2 | 7/2011 | Dean, Jr. et al. | |
| 8,035,965 B2 | 10/2011 | Adducci et al. | |
| 8,040,673 B2 | 10/2011 | Krietzman | |
| 8,087,979 B2 | 1/2012 | Rasmussen | |
| 8,107,238 B2 | 1/2012 | Krietzman et al. | |
| 8,395,046 B2 | 3/2013 | Nicewicz et al. | |
| 8,403,736 B2 | 3/2013 | Rasmussen et al. | |
| 8,405,984 B2 | 3/2013 | Donowho et al. | |
| 8,411,465 B2 | 4/2013 | Dean, Jr. et al. | |
| 8,437,147 B2 | 5/2013 | Dean, Jr. et al. | |
| 8,459,756 B2 | 6/2013 | Linhares et al. | |
| 8,628,158 B2 | 1/2014 | Caveney | |
| 8,653,363 B2 | 2/2014 | Behrens et al. | |
| 8,701,737 B2 * | 4/2014 | Mainers | H05K 7/20745 160/1 |
| 8,730,665 B2 | 5/2014 | Lewis, II et al. | |
| 8,737,068 B2 | 5/2014 | Krietzman et al. | |
| 8,787,023 B2 | 7/2014 | Lewis, II et al. | |
| 8,901,438 B2 | 12/2014 | Lewis, II et al. | |
| 9,055,677 B2 | 6/2015 | Garza, Jr. et al. | |
| 9,072,193 B1 * | 6/2015 | Eichelberg | H05K 7/1488 |
| 9,072,200 B2 | 6/2015 | Dersch et al. | |
| 9,119,329 B2 | 8/2015 | Krietzman et al. | |
| 9,204,577 B2 * | 12/2015 | Noteboom | H05K 7/20736 |
| 9,313,927 B2 | 4/2016 | Krietzman | |
| 2003/0020379 A1 | 1/2003 | Larsen et al. | |
| 2004/0183409 A1 | 9/2004 | Rinderer | |
| 2004/0201335 A1 | 10/2004 | Davis | |
| 2005/0082021 A1 * | 4/2005 | Manning | E05F 1/16 160/371 |
| 2005/0259383 A1 | 11/2005 | Ewing | |
| 2006/0103270 A1 | 5/2006 | Bergesch et al. | |
| 2006/0139877 A1 * | 6/2006 | Germagian | H05K 7/20745 361/695 |
| 2006/0141921 A1 | 6/2006 | Turek et al. | |
| 2006/0260338 A1 * | 11/2006 | VanGilder | H05K 7/20745 62/259.2 |
| 2007/0064389 A1 | 3/2007 | Lewis et al. | |
| 2007/0064391 A1 | 3/2007 | Lewis et al. | |
| 2007/0171613 A1 | 7/2007 | McMahan et al. | |

(56) References Cited

U.S. PATENT DOCUMENTS

| | | |
|---|---|---|
| 2007/0183129 A1 | 8/2007 | Lewis, II et al. |
| 2007/0210679 A1 | 9/2007 | Adducci et al. |
| 2007/0210681 A1 | 9/2007 | Adducci et al. |
| 2007/0210683 A1 | 9/2007 | Adducci et al. |
| 2007/0210686 A1 | 9/2007 | Adducci et al. |
| 2007/0220708 A1 | 9/2007 | Lewis |
| 2007/0221393 A1 | 9/2007 | Adducci et al. |
| 2007/0293138 A1 | 12/2007 | Adducci et al. |
| 2008/0035810 A1 | 2/2008 | Lewis, II |
| 2008/0037228 A1 | 2/2008 | Lewis, II |
| 2008/0062654 A1 | 3/2008 | Mattlin et al. |
| 2008/0067904 A1 | 3/2008 | Adducci et al. |
| 2008/0074849 A1 | 3/2008 | Adducci et al. |
| 2008/0134745 A1 | 6/2008 | Hermanson |
| 2008/0148643 A1* | 6/2008 | Lemming ............ E05D 15/0617 49/409 |
| 2008/0174217 A1 | 7/2008 | Walker |
| 2008/0180004 A1 | 7/2008 | Martich et al. |
| 2008/0266789 A1 | 10/2008 | Hruby et al. |
| 2008/0316702 A1 | 12/2008 | Donowho et al. |
| 2008/0316703 A1 | 12/2008 | Donowho et al. |
| 2009/0059523 A1 | 3/2009 | Mallia et al. |
| 2009/0129013 A1 | 5/2009 | Donowho et al. |
| 2009/0168345 A1* | 7/2009 | Martini ................. F24F 11/0001 361/691 |
| 2009/0173017 A1 | 7/2009 | Hall |
| 2009/0190307 A1 | 7/2009 | Krietzman |
| 2009/0227197 A1 | 9/2009 | Lewis, II et al. |
| 2009/0239460 A1 | 9/2009 | Lucia et al. |
| 2009/0239461 A1 | 9/2009 | Lewis, II et al. |
| 2009/0273915 A1 | 11/2009 | Dean, Jr. et al. |
| 2009/0277605 A1* | 11/2009 | Vangilder ........... H05K 7/20745 165/67 |
| 2010/0061059 A1 | 3/2010 | Krietzman et al. |
| 2010/0172092 A1 | 7/2010 | Davis et al. |
| 2010/0172093 A1 | 7/2010 | Davis et al. |
| 2010/0188816 A1* | 7/2010 | Bean, Jr. ............ H05K 7/20745 361/696 |
| 2010/0304657 A1* | 12/2010 | Gallmann ................. G06F 1/20 454/184 |
| 2010/0307716 A1* | 12/2010 | Bean, Jr. ............ H05K 7/20745 165/80.2 |
| 2011/0019362 A1 | 1/2011 | Krietzman |
| 2011/0148261 A1 | 6/2011 | Donowho et al. |
| 2011/0211328 A1 | 9/2011 | Dean, Jr. et al. |
| 2011/0211329 A1 | 9/2011 | Dean, Jr. et al. |
| 2011/0271610 A1 | 11/2011 | Cottuli et al. |
| 2011/0278999 A1 | 11/2011 | Caveney et al. |
| 2011/0287704 A1 | 11/2011 | Lewis, II et al. |
| 2011/0290553 A1 | 12/2011 | Behrens et al. |
| 2012/0013229 A1 | 1/2012 | Krietzman |
| 2012/0062083 A1 | 3/2012 | Lewis, II et al. |
| 2012/0062084 A1 | 3/2012 | Lewis, II et al. |
| 2012/0062086 A1 | 3/2012 | Garza, Jr. et al. |
| 2012/0062091 A1 | 3/2012 | Donowho et al. |
| 2012/0063099 A1 | 3/2012 | Alaniz et al. |
| 2012/0112612 A1 | 5/2012 | Krietzman |
| 2012/0129441 A1* | 5/2012 | Peng ................... H05K 7/20745 454/184 |
| 2012/0181906 A1* | 7/2012 | Caveney ............ H05K 7/20745 312/237 |
| 2012/0194999 A1 | 8/2012 | Krietzman et al. |
| 2013/0149954 A1 | 6/2013 | North et al. |
| 2013/0160271 A1 | 6/2013 | Krietzman et al. |
| 2013/0165035 A1 | 6/2013 | Krietzman et al. |
| 2014/0132134 A1 | 5/2014 | Garza, Jr. et al. |
| 2014/0196394 A1 | 7/2014 | Greeson et al. |
| 2015/0250071 A1 | 9/2015 | Garza, Jr. et al. |
| 2016/0088773 A1 | 3/2016 | Greeson et al. |

FOREIGN PATENT DOCUMENTS

| | | |
|---|---|---|
| EP | 2429271 | 3/2012 |
| EP | 2429272 | 3/2012 |
| GB | 2366084 B | 9/2002 |
| WO | 2006055506 A2 | 5/2006 |
| WO | 2008022058 A2 | 2/2008 |
| WO | 2008022058 A3 | 11/2008 |
| WO | 2008144678 A1 | 11/2008 |
| WO | 2009089008 A2 | 7/2009 |
| WO | 2009103090 A2 | 8/2009 |
| WO | 2009103090 A3 | 10/2009 |
| WO | 2010028384 A2 | 3/2010 |
| WO | 2010028384 A3 | 5/2010 |

OTHER PUBLICATIONS

Information Disclosure Statement (IDS) Letter Regarding Common Patent Applications(s), dated May 2, 2016.

Chatsworth Products, Inc., "Thermal Management Solutions", Signature Solutions Brochure, Revision dated Mar. 2008, www.chatsworth.com/passivecooling (6 pages).

DCR Product Brochure, accessed at www.datacenterinarow.com, on or about Mar. 2011 (25 pages).

HP 10000 G2 42U Rack Air Duct Installation Guide, Hewlett-Packard Development Company, LP, dated Aug. 2008 (23 pages).

Panduit Net-Access Vertical Exhaust System (VES) Specification Sheet, Panduit Corporation, dated Feb. 2011 (4 pages).

Panduit Net-Access Vertical Exhaust Duct (VED) Instructions, Panduit Corporation, dated 2009 (4 pages).

Information Disclosure Statement (IDS) Letter Regarding Common Patent Applications(s), dated Jul. 28, 2016.

* cited by examiner

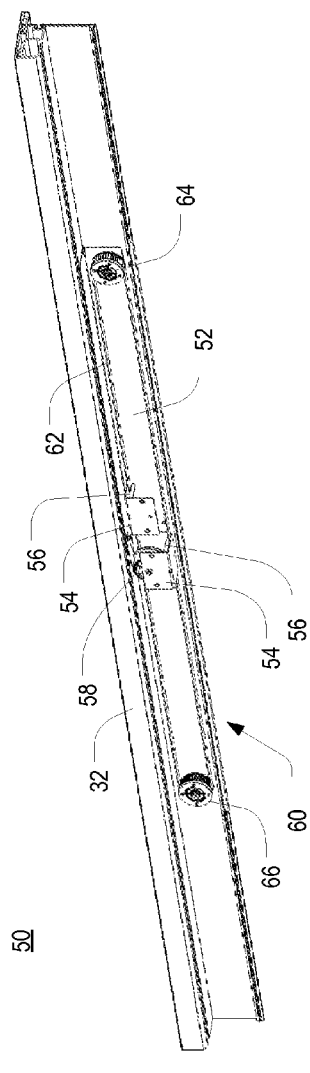
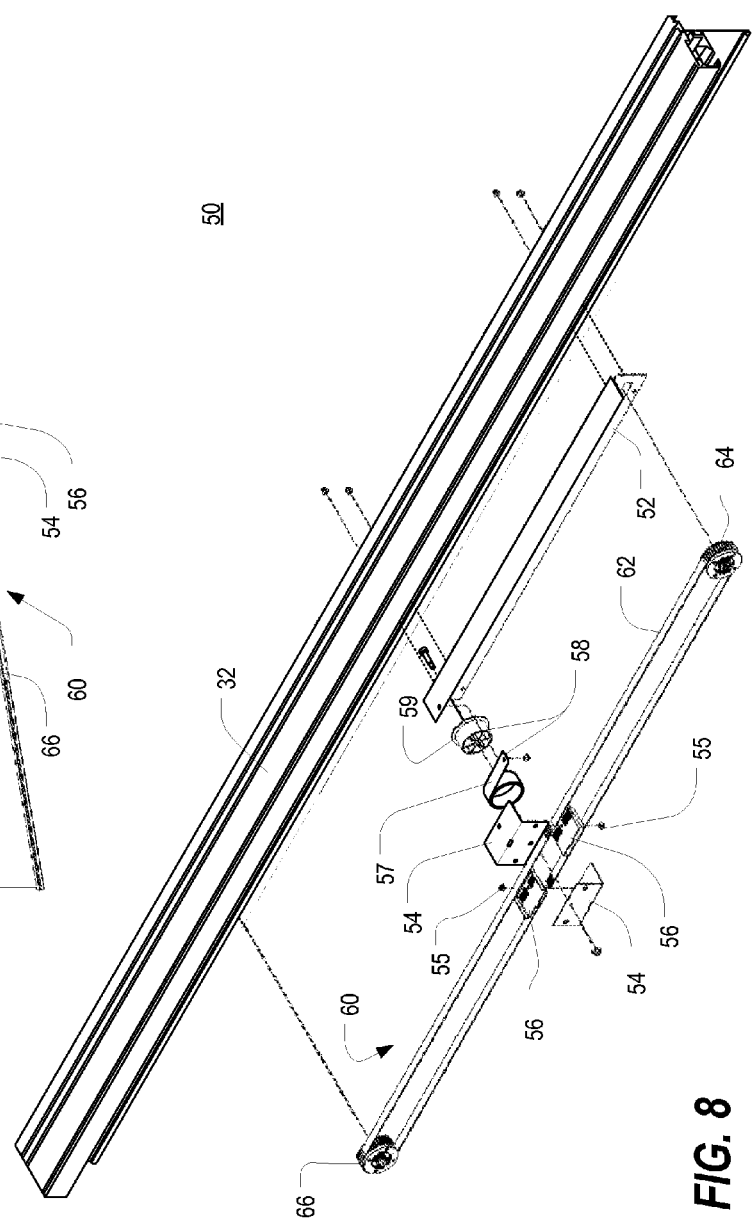

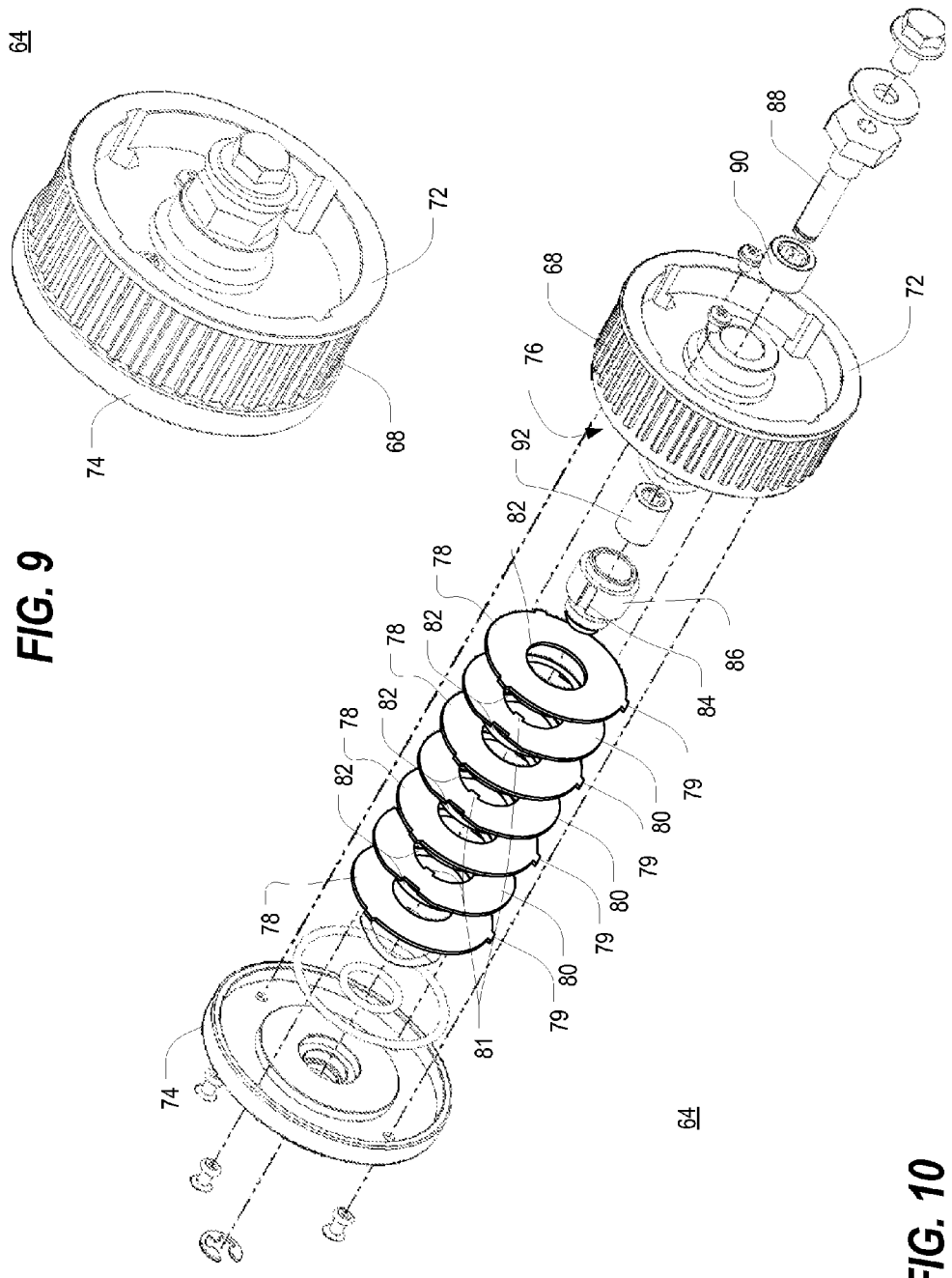

DOOR CLOSER MECHANISM FOR HOT/COLD AISLE AIR CONTAINMENT ROOM

CROSS-REFERENCE TO RELATED APPLICATIONS

The present application is a U.S. non-provisional patent application of, and claims priority under 35 U.S.C. §119(e) to, U.S. provisional patent application Ser. No. 61/597,301, filed Feb. 10, 2012, which is expressly incorporated herein by reference in its entirety. Additionally, each of the following commonly-assigned U.S. patent applications, including any application publication thereof, is expressly incorporated herein by reference in its entirety:
  (a) U.S. provisional patent application Ser. No. 61/411,359, filed Nov. 8, 2010 and entitled, "ADJUSTABLE WALL ASSEMBLY FOR HOT/COLD AISLE CONTAINMENT SYSTEM," attached hereto as Appendix A, which itself is expressly incorporated herein by reference in its entirety;
  (b) U.S. provisional patent application Ser. No. 61/568,692, filed Dec. 9, 2011 and entitled, "DATA PROCESSING EQUIPMENT STRUCTURE;" and
  (c) U.S. non-provisional patent application Ser. No. 13/707,521, filed Dec. 6, 2012 and entitled, "DATA PROCESSING EQUIPMENT STRUCTURE," which '521 application published as U.S. Patent Application Publication No. US 2013/0149954 A1 on Jun. 13, 2013.

COPYRIGHT STATEMENT

All of the material in this patent document is subject to copyright protection under the copyright laws of the United States and other countries. The copyright owner has no objection to the facsimile reproduction by anyone of the patent document or the patent disclosure, as it appears in official governmental records but, otherwise, all other copyright rights whatsoever are reserved.

BACKGROUND OF THE PRESENT INVENTION

Field of the Present Invention

The present invention relates generally to door assemblies for electronic equipment hot/cold aisle air containment rooms, and, in particular, to door assemblies having a door closer mechanism.

Background

Racks, frames and enclosures for mounting and storing computer and other electronic components or equipment have been well known for many years. Racks and frames are typically simple rectangular frameworks on which electronic components may be mounted, or on which other mounting members, such as shelves or brackets, may be mounted which in turn may support the electronic components. Enclosures are typically frames on which panels or doors, or both, are hung to provide aesthetic improvement, to protect the components from external influences, to provide security for the components stored inside, or for other reasons.

Racks, frames and enclosures have been built in many different sizes and with many different proportions in order to best accommodate the components which they are designed to support and store. Components stored in these enclosures may include audio and video equipment and the like, but quite frequently include computer equipment and related peripheral devices. These components typically include housings enclosing internal operative elements.

As is also well known, the electronic equipment mounted in these structures tends to generate large amounts of thermal energy that needs to be exhausted away from the equipment effectively in order to maintain the equipment in proper operating order or to prevent damage thereto. The problem can be especially significant when the components are enclosed in enclosures, because thermal energy generated thereby can concentrate within the equipment enclosure and cause the components to overheat and shut down. As equipment becomes more densely packed with electronics, the quantities of thermal energy have continued to increase in recent years, and thermal energy management has become a significant issue confronting today's rack, enclosure, frame and enclosure manufacturers, the manufacturers of the electronic equipment, and the users of such equipment.

Typically, multiple racks, frames, enclosures, and the like (sometimes collectively referred to hereinafter as "enclosures") are housed together in a data center room. Because of the overheating problem, and particularly with multiple enclosures being placed in a single room, thermal management of the data center room is very important. A goal of data center thermal management is to maximize the performance, uptime and life expectancy of the active components being housed in the room. Toward this end, data center rooms are often arranged so as to increase efficiency and optimize performance.

One common way of organizing a data center room to meet these objectives involves arranging individual enclosures in rows, with the air intake of each enclosure facing toward one side of the row and the heated air exhaust of each enclosure facing toward the other side of the row. Rows of enclosures are arranged in back-to-back relationship so that enclosures of two separate rows receive cool intake air from a common "cold" aisle between the rows, exhaust heated air into a common "hot" aisle between the rows, or utilize a combination thereof. Various permutations of these arrangements are well known.

When "cold" or "hot" aisle approaches are utilized, they must still accommodate human access into the aisle so as to access the enclosures themselves. In older implementations, no special walls or other structures are utilized to maximize separation of the aisles from the environment, but more recently, the cold and hot aisle effect has been enhanced through the use of such structures. In these implementations, it has become more necessary to provide doors for access to the interior of the aisles. This, in turn, has created a need for improvements in door assemblies to address such issues as doors being left open accidentally, but without creating additional power requirements. This and other needs are addressed by the present invention.

SUMMARY OF THE PRESENT INVENTION

The present invention comprises a hot/cold aisle air containment room. Broadly defined, the present invention according to a first aspect includes a hot/cold aisle air containment room substantially as shown and described.

Broadly defined, the present invention according to a second aspect includes a hot/cold aisle air containment room, having a door closer mechanism, substantially as shown and described.

Broadly defined, the present invention according to a third aspect includes a hot/cold aisle air containment room that includes a pair of rows of electronic equipment enclosures defining an interior aisle therebetween, a frame structure supporting one or more ceiling panels above the interior aisle, and a door assembly. The door assembly includes one or more doors and has a door closer mechanism to provide controlled access to the interior aisle.

In features of this aspect, the interior aisle may be a cold aisle; and/or the interior aisle may be a hot aisle.

In further features of this aspect, the door closer mechanism may include a belt/pulley assembly supported by a rail extrusion of the door assembly; the belt/pulley assembly may include a damper pulley, a free pulley, and a timing belt routed around the damper pulley and the free pulley; the timing belt may be toothed; each of the damper pulley and the free pulley may include a cylindrical bearing surface having a series of teeth that interlock with the toothed timing belt; the one or more doors may be attached to the timing belt via a splice bracket and a belt splice plate, thereby allowing the one or more doors to be controlled relative to the timing belt; the door assembly may further include a return spring mounted on a spool to provide resistance to the one or more doors; a biasing force of the return spring may be resisted by the damper pulley; the damper pulley may be permitted to rotate freely in one direction and is damped in the other direction; the damper pulley may be permitted to rotate freely when the one or more doors are being opened; and/or the damper pulley may be damped when the one or more doors are being closed.

Broadly defined, the present invention according to a fourth aspect includes a method of opening and closing one or more doors in a hot/cold aisle air containment room, substantially as shown and described.

Broadly defined, the present invention according to a fifth aspect includes a hot/cold aisle air containment room. The hot/cold aisle air containment room includes a plurality of electronic equipment enclosures at least partially defining an interior aisle, a frame structure supporting one or more ceiling panels above the interior aisle, and a door assembly. The door assembly includes a sliding door and am unpowered door closer mechanism adapted to move the sliding door from an open state to a closed state, thereby providing controlled access to the interior aisle and minimizing intermixing of hot air and cold air between an environment external to the hot/cold aisle air containment room and an environment internal to the hot/cold aisle air containment room.

In features of this aspect, the hot/cold aisle air containment room may be disposed within a room in a building; the interior aisle may be a cold aisle; and/or the interior aisle may be a hot aisle.

In further features of this aspect, the plurality of electronic equipment enclosures may be arranged in a row, wherein the interior aisle includes two sides and two ends, and wherein the row of electronic equipment enclosures defines one side of the interior aisle; and/or the plurality of electronic equipment enclosures may be arranged in a pair of rows, and wherein the pair of rows of electronic equipment enclosures define opposite sides of the interior aisle.

In further features of this aspect, the hot/cold aisle air containment room may further include one or more wall panels; the wall panels may at least partially define at least one end or side of the interior aisle; and/or the wall panels may be a part of the door assembly.

In further features of this aspect, the door assembly may be disposed at one end of the interior aisle; the sliding door may be a first sliding door, wherein the door assembly includes a second sliding door, and wherein the unpowered door closer mechanism is adapted to move the first sliding door and the second sliding door simultaneously from an open state to a closed state; and/or the door closer mechanism may include a belt/pulley assembly supported by a rail assembly.

In further features of this aspect, the belt/pulley assembly may include a damper pulley, a free pulley, and a belt routed around the damper pulley and the free pulley, wherein the sliding door is attached to the belt, thereby allowing the sliding door to be controlled relative to the belt; the belt may be a synchronous belt; the synchronous belt may be toothed; and/or each of the damper pulley and the free pulley may include a cylindrical bearing surface having a series of teeth that interlock with the toothed synchronous belt.

In further features of this aspect, the hot/cold aisle air containment room may further include a pulley tensioning device; the sliding door may be attached to the belt via a splice bracket and a belt splice plate; the door assembly may further include a return spring mounted on a spool to provide resistance to the sliding door; and/or a biasing force of the return spring may be resisted by the damper pulley.

In further features of this aspect, the damper pulley may be permitted to rotate freely in one direction and is damped in the other direction; the damper pulley may be permitted to rotate freely when the sliding door is being opened; and/or the damper pulley may be damped when the sliding door is being closed.

In further features of this aspect, the rail assembly may include a main rail extrusion supporting at least one roller bracket assembly; each roller bracket assembly may include at least one roller that rides along a portion of the main rail extrusion and that supports a roller bracket which supports the sliding door; and/or the at least one roller may ride in a roller cavity in the main rail extrusion.

In still further features of this aspect, a spring bracket may be attached at one end of the rail assembly, wherein a structure is provided that engages the spring bracket when the sliding door is moved to a fully open state; the structure may be disengageable from the spring bracket by pulling the door closed; and/or the hot/cold aisle air containment room may further include a roller bracket assembly that carries the door, wherein the structure is a portion of the roller bracket assembly.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein:

FIG. 7 is an orthogonal view of the door closer mechanism of FIG. 3;

FIG. 8 is an exploded isometric view of the door closer mechanism of FIG. 7;

FIG. 9 is an isometric view of the damper pulley of FIG. 8;

FIG. 10 is an exploded isometric view of the damper pulley of FIG. 9;

DETAILED DESCRIPTION

Figure 1:
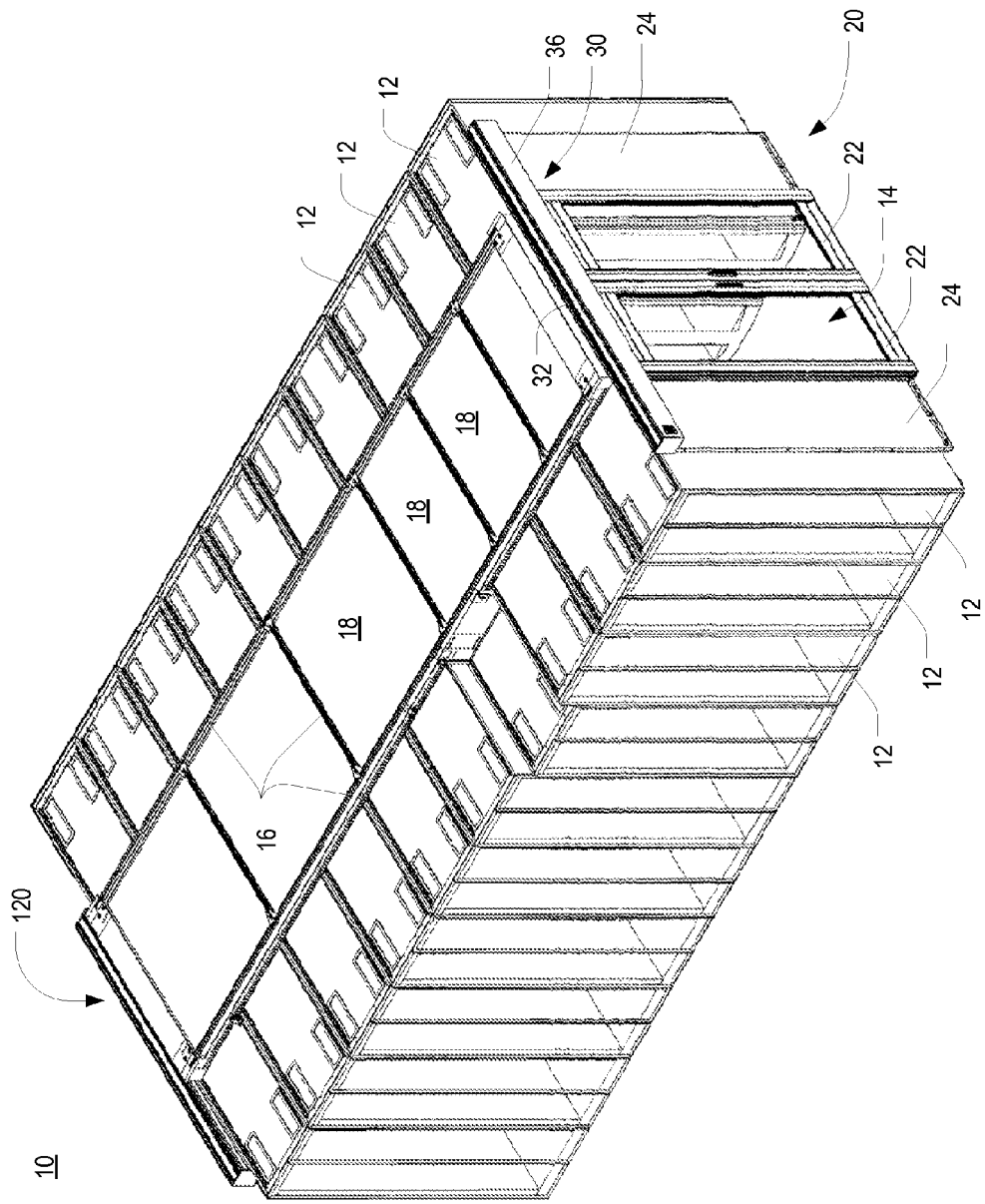
FIG. 1 is a front isometric view of a containment room having a double door assembly with a door closer mechanism in accordance with one or more preferred embodiments of the present invention.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. As should be understood, any embodiment may incorporate only one or a plurality of the above-disclosed aspects of the invention and may further incorporate only one or a plurality of the above-disclosed features. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

Regarding applicability of 35 U.S.C. §112, ¶6, no claim element is intended to be read in accordance with this statutory provision unless the explicit phrase "means for" or "step for" is actually used in such claim element, whereupon this statutory provision is intended to apply in the interpretation of such claim element.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers," "a picnic basket having crackers without cheese," and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, in which like numerals represent like components throughout the several views, one or more preferred embodiments of the present invention are next described. The following description of one or more preferred embodiment(s) is merely exemplary in nature and is in no way intended to limit the invention, its application, or uses.

Figure 2:
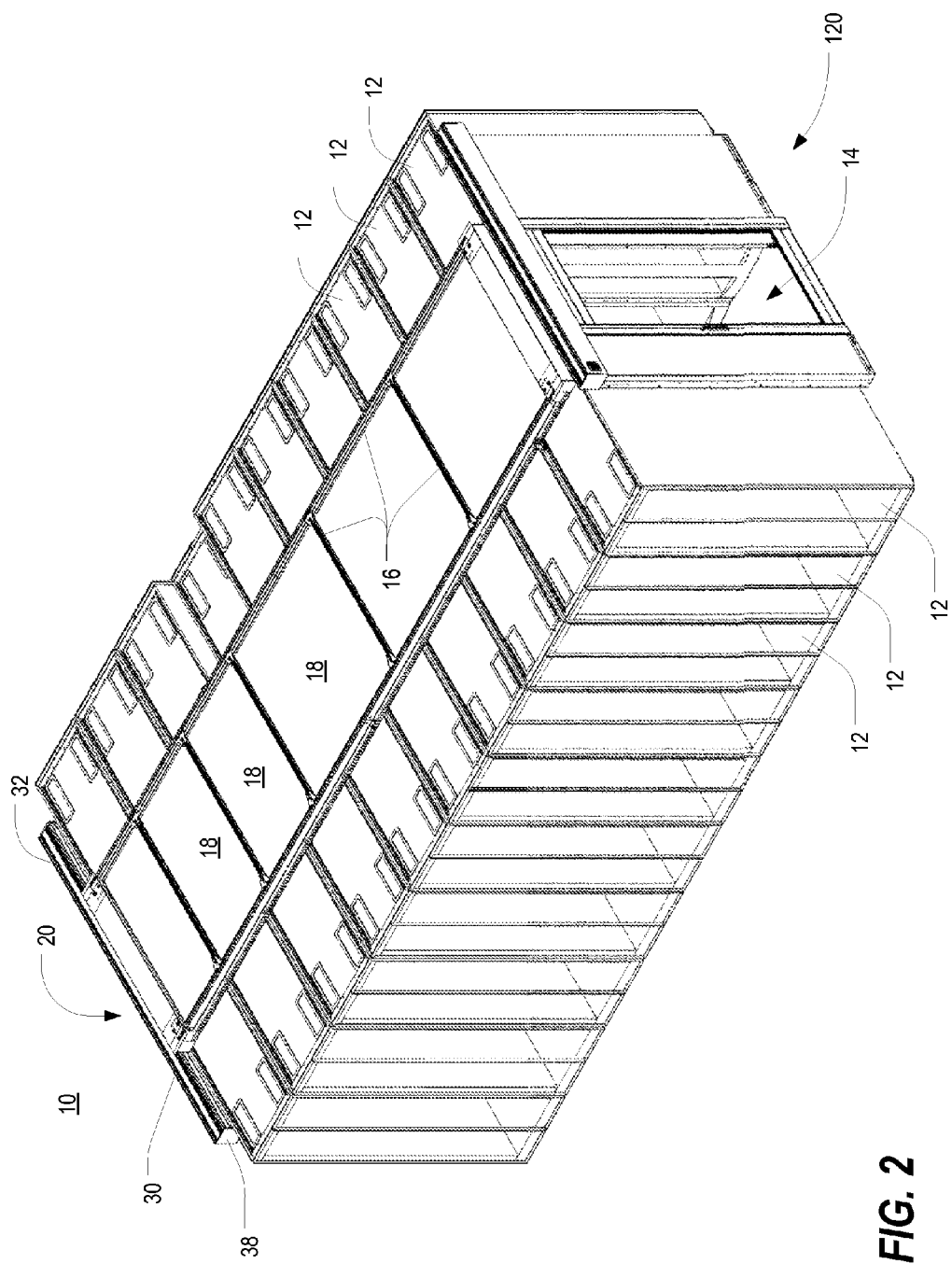
FIG. 2 is a rear isometric view of the containment room of FIG. 1, illustrating a single door assembly with a door closer mechanism in accordance with one or more preferred embodiments of the present invention.

FIG. 1 is a front isometric view of a containment room 10 having a double door assembly 20 with a door closer mechanism in accordance with one or more preferred embodiments of the present invention, and FIG. 2 is a rear isometric view of the containment room 10 of FIG. 1, illustrating a single door assembly 120 with a door closer mechanism in accordance with one or more preferred embodiments of the present invention. As shown therein, two rows of equipment enclosures 12, each of which may house a variety of data processing equipment, are arranged opposite each other along an interior aisle 14. As used herein, the term "data processing equipment" refers to a wide range of electronic equipment as well as racks, frames, enclosures, and the like that are typically used to house such equipment. A frame structure 16 supports ceiling panels 18 above the interior aisle 14. Access to the interior aisle 14 is provided at the front end by the double door assembly 20 and at the rear end by the single door assembly 120.

Together, the ceiling panels 18, the door assemblies 20,120 and the equipment enclosures 12 themselves fully enclose the interior aisle 14, and the entire structure of the containment room 10 may rest on the floor surface in a data center room (not shown). In many embodiments, cool air is supplied to the interior aisle 14, where it is allowed to pass through doors or openings in the inward-facing sides of the equipment enclosures 12. This type of arrangement is commonly referred to as a "cold" aisle. The air is used to cool equipment operating inside the enclosures 12, and the heated air resulting from this process is exhausted out the rear or top of the enclosures 12. However, in some embodiments, the heated air is exhausted out the bottoms of the enclosures 12. Furthermore, in some embodiments, cool air is provided to the outward-facing sides of the equipment enclosures 12, and heated air is exhausted to the interior aisle 14, where it may be routed downward through the floor, upward through various overhead duct structures (not shown), or routed back to cooling units (not shown) located next to the enclosures 12 themselves. This type of arrangement is commonly referred to as a "hot" aisle. Various implementations of cold and hot aisles are described, for example, in commonly-assigned U.S. non-provisional patent application Ser. No. 13/707,521, filed Dec. 6, 2012, which is expressly incorporated herein by reference in its entirety. It will be appreciated that the door assemblies 20,120 and door closer mechanisms described and illustrated herein have applicability in any of these environments and applications.

Figure 3:
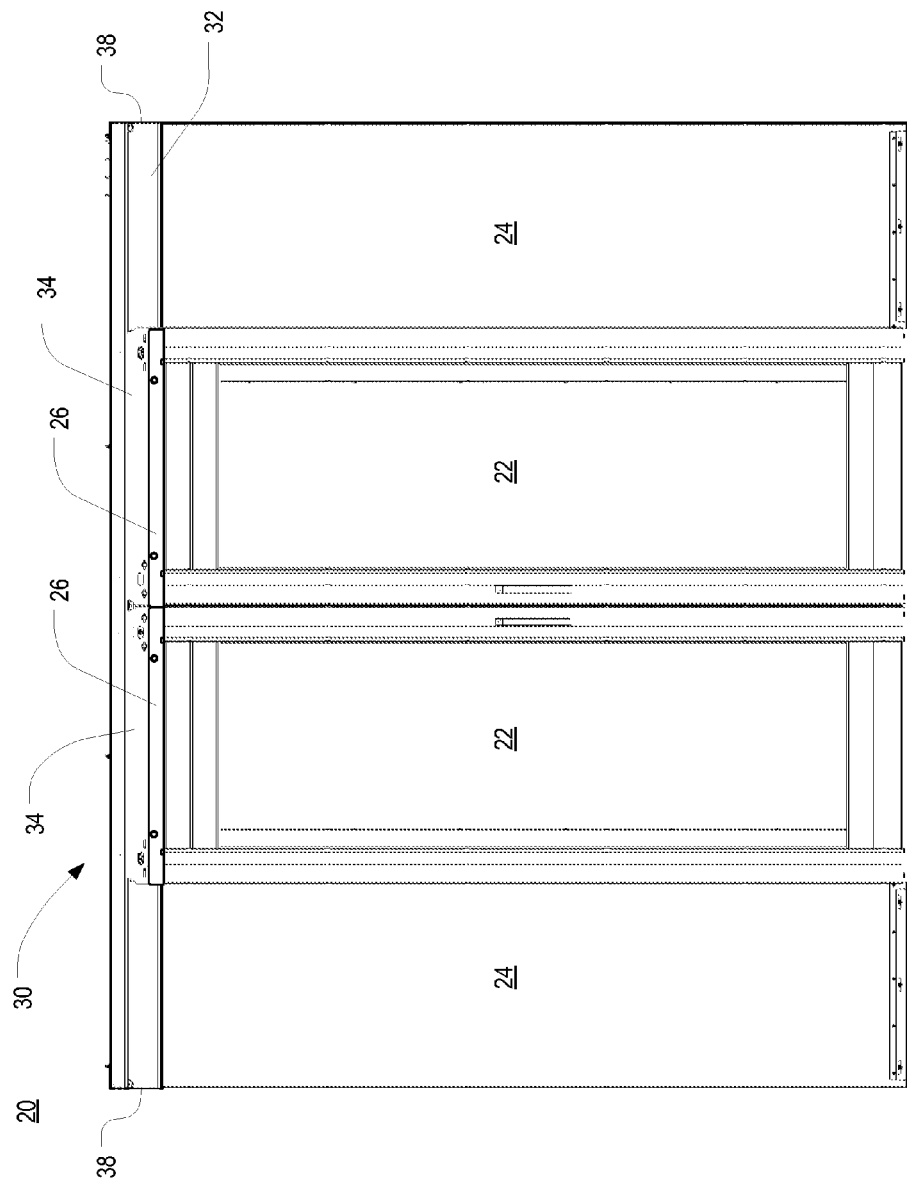
FIG. 3 is a front view of the double door assembly of FIG. 1, shown with the front cover of the rail assembly removed.
Figure 4:
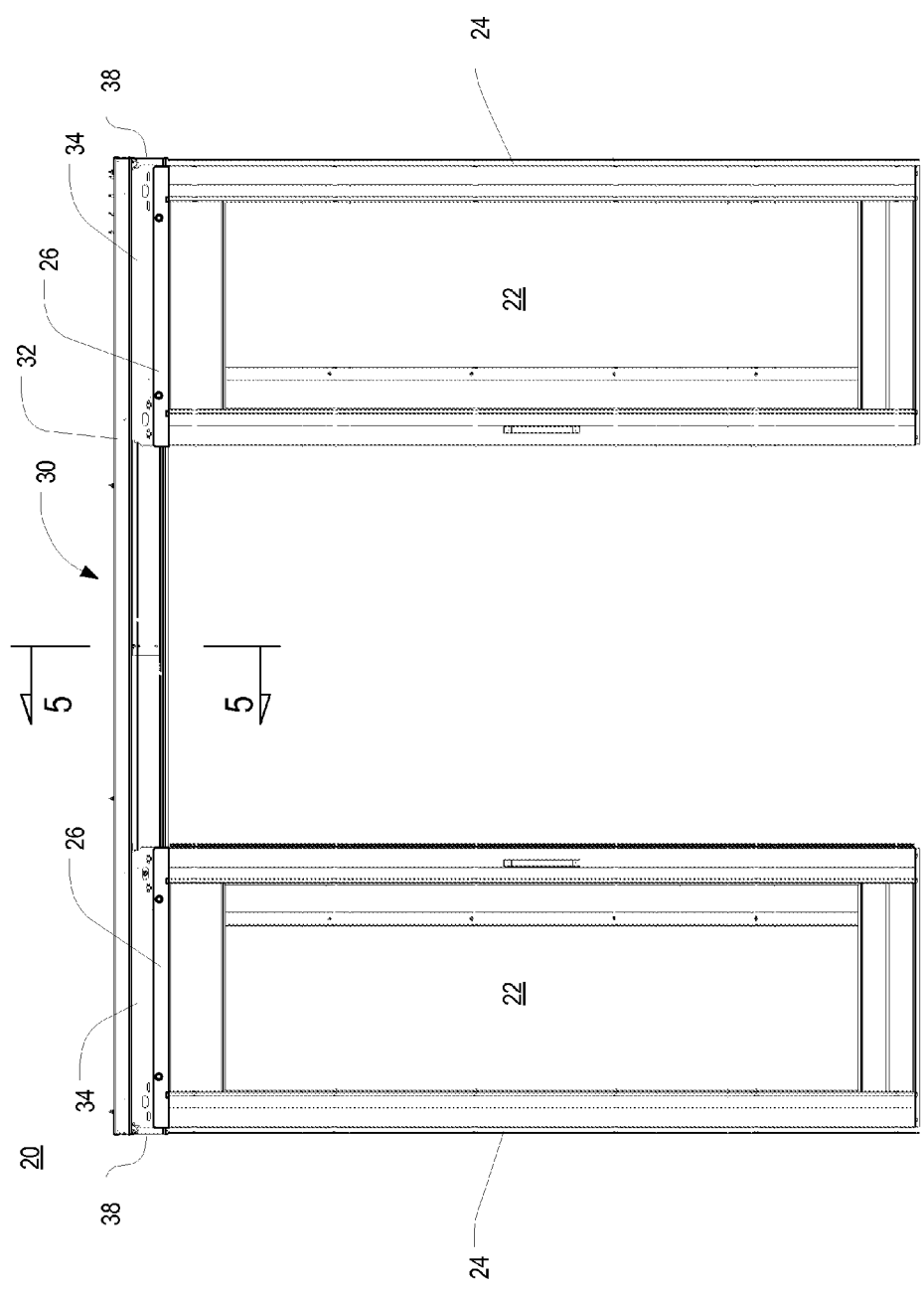
FIG. 4 is a front view of the double door assembly of FIG. 3, shown with the doors in an open state.

As shown in FIG. 1, the double door assembly 20 includes two doors 22, two side wall panels 24, a rail assembly 30, and a door closer mechanism 50. FIG. 3 is a front view of the double door assembly 20 of FIG. 1, shown with the front cover 36 of the rail assembly 30 removed, and FIG. 4 is a front view of the double door assembly 20 of FIG. 3, shown with the doors 22 in an open state. The rail assembly 30, which may be mounted to the frame structure 16 of the containment room 10, supports the door closer mechanism 50 (perhaps best shown in FIG. 7) and the doors 22, and further provides a mounting surface for the upper ends of the panels 24. The lower ends of the panels 24 may be attached to the floor. In at least some embodiments, the lower ends of the panels 24 are also sealed to the floor to prevent air from passing underneath. In at least some embodiments, seals (not shown) are provided along the entire vertical lengths of the right and left edges of each door 22.

The rail assembly 30 includes a main rail extrusion 32, a pair of roller bracket assemblies 34, the front cover 36, and a pair of end caps 38. Each door 22 has a support rail 26 mounted along the upper end thereof, and each support rail 26 may be attached to a respective roller bracket assembly 34. The roller bracket assemblies 34 are carried by the main rail extrusion 32. The doors 22 may be opened by pulling them apart, causing the roller bracket assemblies 34 to spread apart along the main rail extrusion 32.

Figure 5:
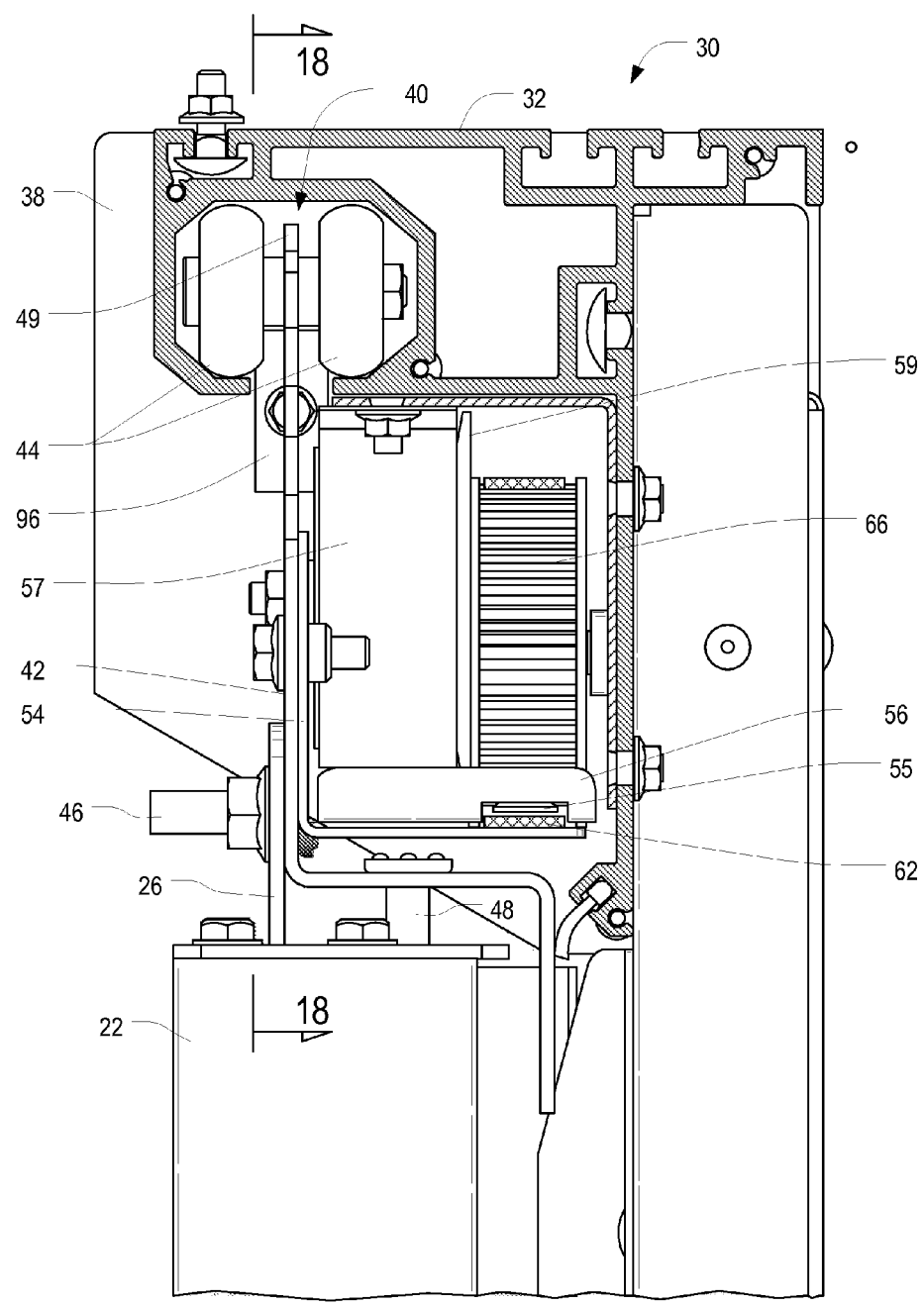
FIG. 5 is a fragmentary side cross sectional view of the rail assembly of FIG. 4, taken along line 5-5.
Figure 6:
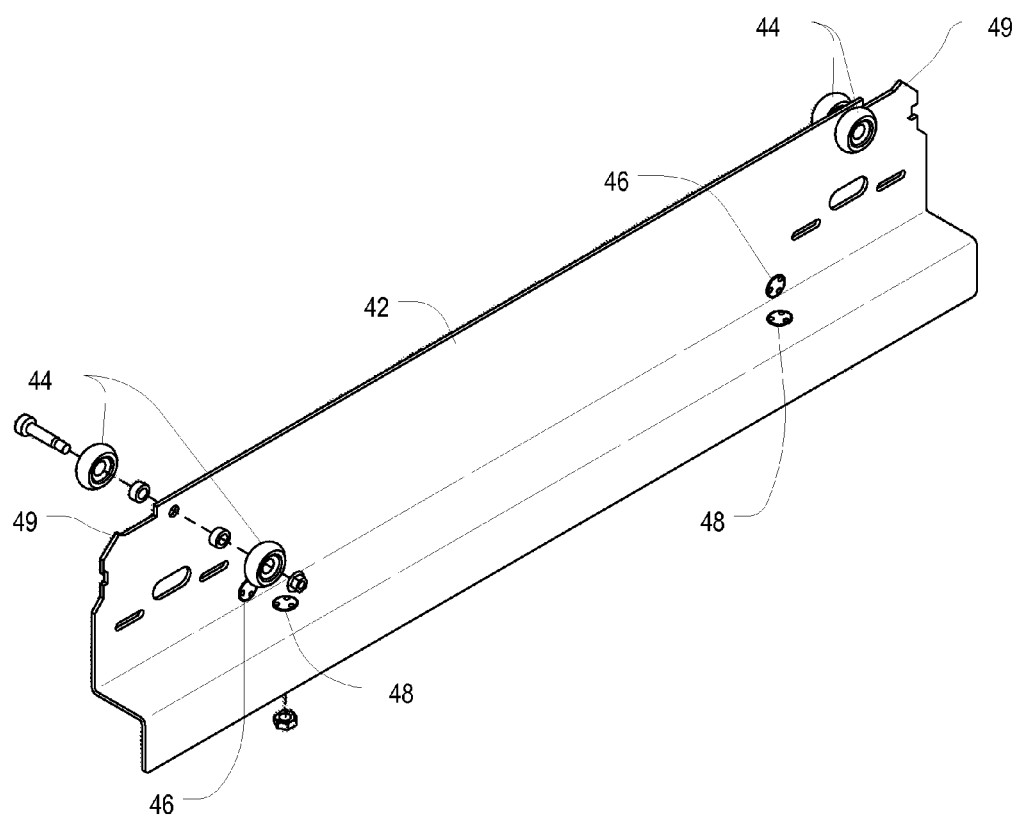
FIG. 6 is a partially exploded isometric view of one of the roller bracket assemblies of FIG. 3.

FIG. 5 is a fragmentary side cross sectional view of the rail assembly 30 of FIG. 4, taken along line 5-5, and FIG. 6 is a partially exploded isometric view of one of the roller bracket assemblies 34 of FIG. 3. As shown therein, each roller bracket assembly 34 includes a bracket 42 and two sets of ball bearing rollers 44. The support rail 26 of the door 22 is secured to a portion of the bracket 42 via fasteners 46, and the top of the door 22 itself is secured to another portion of the bracket 42 via additional fasteners 48. The two sets of ball bearing rollers 44, preferably made from nylon or similar plastic material, are mounted at the upper edge of the bracket 42 and are arranged to ride in a roller cavity 40 in the main rail extrusion 32, thus allowing the bracket 42 (and the door 22 which it carries) to roll back and forth.

FIG. 7 is an orthogonal view of the door closer mechanism 50 of FIG. 3, and FIG. 8 is an exploded isometric view of the door closer mechanism 50 of FIG. 7. As shown therein, the door closer mechanism 50 includes a belt/pulley assembly 60, a mounting bracket 52, a pair of belt splice brackets 54, a pair of belt splice plates 56, and a return spring assembly 58, all supported by the main rail extrusion 32. Primary operation is facilitated by the belt/pulley assembly 60, which includes a timing or other synchronous belt 62, a damper pulley 64, and a free pulley 66. The free pulley 66 may be mounted directly to the main rail extrusion 32, while the damper pulley 64 may be fastened to one end of the mounting bracket 52, which itself is fastened to the main rail extrusion 32. The synchronous belt 62 is routed around the free pulley 66 and the damper pulley 64 and maintained in sufficient tension to enable operation, as further described below. The synchronous belt 62 is preferably made from polyurethane with steel cords, but other soft plastics may alternatively or additionally be used as well as other cord materials, such as fiberglass. Furthermore, in some embodiments, a flat belt could be used in place of the toothed belt with the inclusion of a pulley tensioning device; and still further, other types of belts, such as a vee belt, could also be used.

Figure 11:
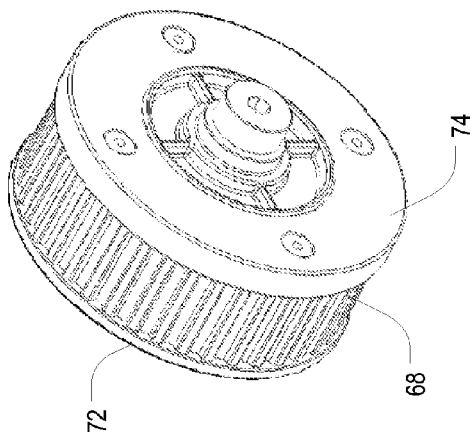
FIG. 11 is an isometric view of the free pulley of FIG. 8.
Figure 12:
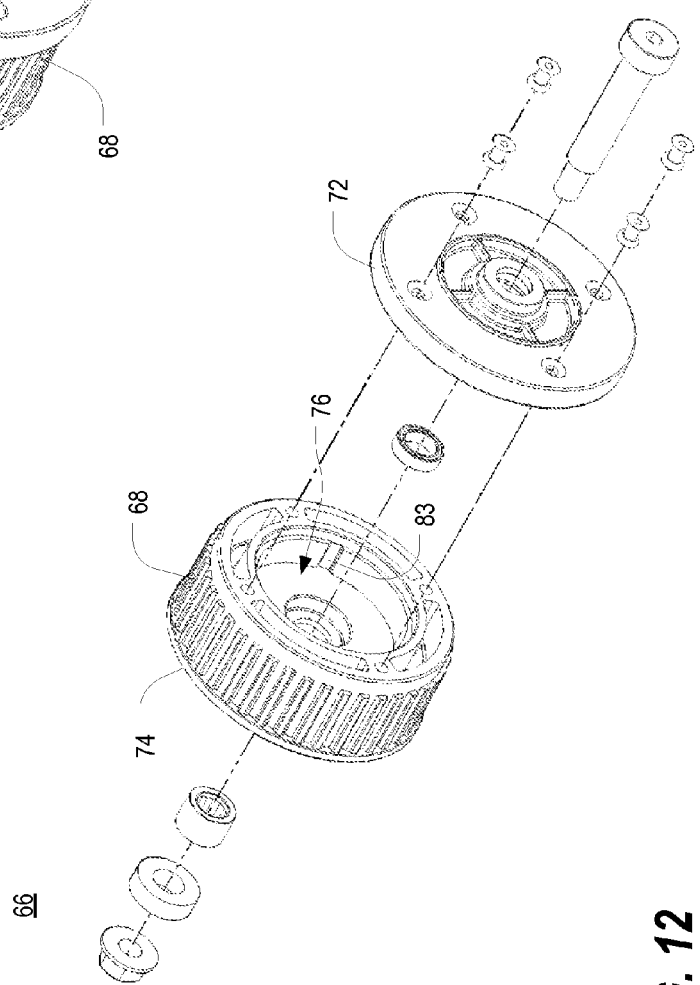
FIG. 12 is an exploded isometric view of the free pulley of FIG. 11.

FIGS. 9 and 10 are an isometric view and an exploded isometric view, respectively, of the damper pulley 64 of FIG. 8, and FIGS. 11 and 12 are an isometric view and an exploded isometric view, respectively, of the free pulley 66 of FIG. 8. As perhaps best shown in FIGS. 9 and 11, the cylindrical bearing surface 68 of both pulleys 64,66 includes a series of teeth that interlock with the teeth on the synchronous belt 62. Once the synchronous belt 62 is engaged around the pulleys 64,66 and properly adjusted, the respective rotations of the pulleys 64,66 are thus locked together. The damper pulley 64 and its operation will be further described hereinbelow.

Figure 13:
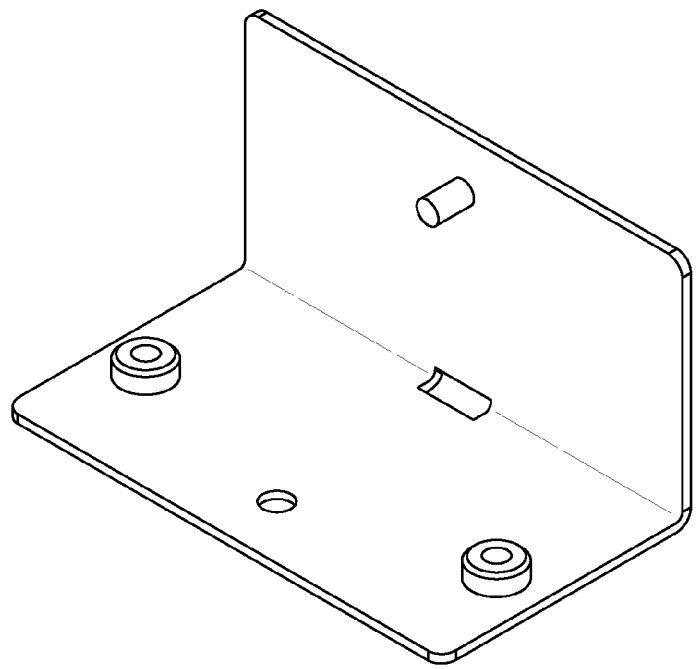
FIG. 13 is an isometric view of one of the belt splice brackets of FIG. 8.
Figure 14:
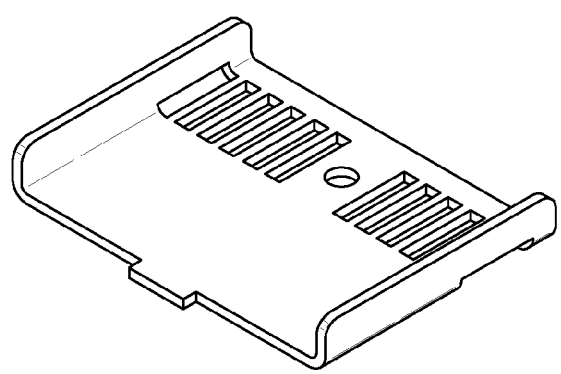
FIG. 14 is an isometric view of one of the belt splice plates of FIG. 8.

Each door 22 is attached to the synchronous belt 62 via a combination of a belt splice bracket 54 and a belt splice plate 56. FIG. 13 is an isometric view of one of the belt splice brackets 54 of FIG. 8, and FIG. 14 is an isometric view of one of the belt splice plates 56 of FIG. 8. As perhaps best shown in FIG. 5, the belt splice bracket 54 and belt splice plate 56 may be clamped together around the synchronous belt 62 and held together by a fastener 55, as perhaps best illustrated in FIGS. 5 and 8. The belt splice bracket 54 is fastened to the bracket 42 of the roller bracket assembly 34, as shown in FIG. 5. Thus, each door 22 is connected to the synchronous belt 62 (via the support rail 26, roller bracket assembly 34, and belt splice bracket/plate 54,56) at a particular location along the belt 62, thereby allowing the position of the door 22 to be precisely controlled relative to the synchronous belt 62 and to each other. Notably, one door 22 is connected to the lower portion of the synchronous belt 62, while the other door 22 is connected to the upper portion. As shown in FIGS. 7 and 8, this is accomplished by inverting the belt splice bracket 54 and belt splice plate 56 for the latter of the two doors 22. Thus, movement of the belt 62 in one rotational direction causes the two belt splices to move apart (clockwise in FIGS. 7 and 8), while movement of the belt 62 in the opposite rotational direction (counter-clockwise in FIGS. 7 and 8) causes the two belt splices to move toward each other. Put another way, separation of (opening) the two doors 22 causes the two belt splices to move apart, thereby causing the belt 62 to move in one rotational direction (clockwise in FIGS. 7 and 8), while moving the two doors 22 toward each other (i.e., closing the doors) causes the two belt splices to move toward each other, thereby causing the belt 62 to move in the opposite rotational direction (counterclockwise in FIGS. 7 and 8).

Figure 15:
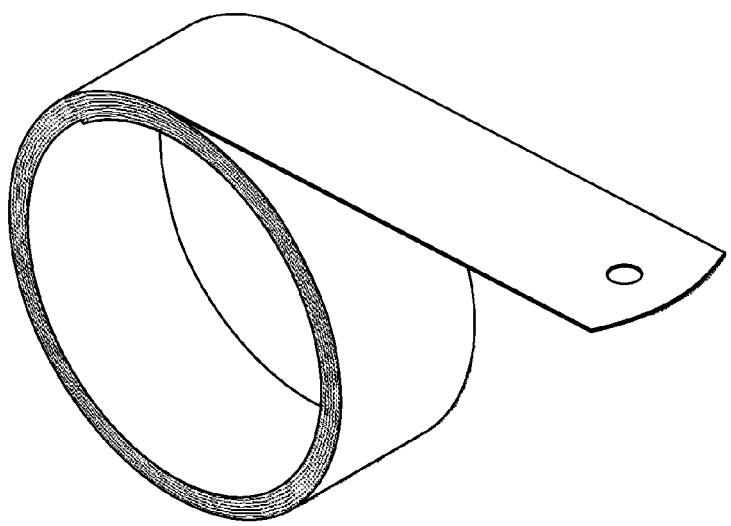
FIG. 15 is an isometric view of the return spring of FIG. 8.
Figure 16:
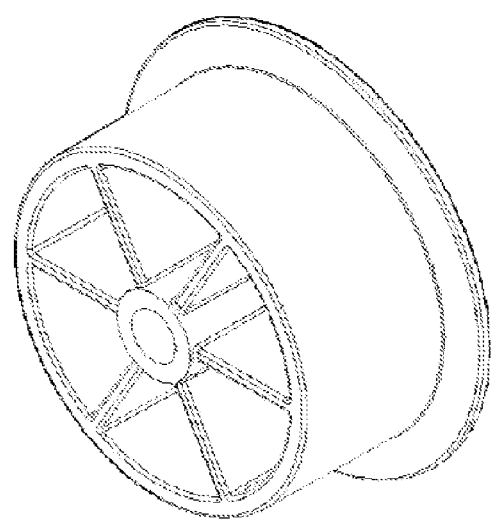
FIG. 16 is an isometric view of the return spring spool of FIG. 8.

A return spring 57, mounted on a spool 59, is mounted to one of the roller bracket assemblies 34. FIG. 15 is an isometric view of the return spring 57 of FIG. 8, and FIG. 16 is an isometric view of the return spring spool 59 of FIG. 8. One end of the spring 57 itself is attached to the mounting bracket 52. In the illustrated embodiment, the mounting bracket 52 is on the right, the damper pulley 64 is connected to the right end of the mounting bracket 52, the return spring spool 59 is connected to the belt splice bracket 54 on the left, and the end of the spring 57 is attached to the left end of the mounting bracket 52. It will be appreciated, however, that various of these elements and others may be rearranged while still accomplishing the same basic functionality. The spring 57 is preferably a constant-force spring which unrolls as the belt splice bracket 54, to which it is attached, is moved away from the mounting bracket 52. Thus, in FIGS. 7 and 8, movement of the lefthand belt splice bracket 54 to the left causes the return spring spool 59 to move to the left. Because the end of the spring 57 is attached to the mounting bracket 52, which remains stationary, the spring 57 unwinds as the spool 59 moves, thus resisting the movement of the belt splice bracket 54 (and the door 22 to which it is attached). When the door 22 is released, the force of the spring 57 acts to pull the belt splice bracket 54, and the door 22 to which it is attached, back toward the mounting bracket 52. Furthermore, because both doors 22 are attached to the same synchronous belt 62, movement of the lefthand belt splice bracket 54 effectuates synchronized movement of the righthand belt splice bracket 54 (and the righthand door 22) as well.

The biasing force applied by the return spring 57 is resisted by the damper pulley 64, whose construction and operation are described next with particular reference to FIG. 10. As shown therein, the damper pulley 64 includes a main body 72 and a cover 74, which for convenience may be similar to the construction of the free pulley 66, shown in FIG. 12. The main body 72 and the cover 74 define an interior compartment 76. In the interior compartment of the damper pulley 64, two sets of alternating discs 78,80 are arranged, separated by spacers 82. Each of the discs 78 in the first set includes three guide teeth 79, disposed around the periphery thereof, that are arranged to fit into corresponding grooves 83 on the interior of the main damper body 72 (visible in the interior of the main pulley body 72 in FIG. 12). Each of the discs 80 in the second set includes two guide teeth 81, disposed around the center opening thereof, that are arranged to fit into grooves 84 in the external surfaces of a hub 86. A main axle 88 is inserted through two sets of bearings 90,92, one set of which is press-fit into the hub 86. The interior compartment 76 is filled with oil and the main body 72 and cover 74 are sealed together.

In operation, the damper pulley 64 rotates freely in one direction, but the damping mechanism limits the rotational speed significantly in the opposite direction. In the door closer mechanism 50, the damper pulley 64 is allowed to rotate freely when the doors 22 are being opened (i.e., when the synchronous belt 62 is moved in the clockwise direction in FIGS. 7 and 8), but the damping mechanism limits rotational speed when the doors 22 are being closed (i.e., when the synchronous belt 62 is moved in the counterclockwise direction in FIGS. 7 and 8). Thus, although the return spring 57 tends to force the doors 22 closed any time the doors 22 are placed in an opened state, the force applied by the spring 57 is counterbalanced by the damping effect of the damping pulley 64. However, the damping mechanism does not provide any resistance to the doors 22 being opened, and the resistance offered by the return spring 57 may be easily overcome by the user.

Advantageously, the door closer mechanism 50 provides a convenient means for causing the doors 22 shown in FIG. 1 to be closed automatically, but without risk of sudden or violent closings, and without the need for any electrical power or other power requirements. The constant force spring 57, counterbalanced by the damping mechanism, causes the door to be closed at a near-constant speed that is conveniently slow. Furthermore, in the double door assembly 20, both doors 22 may be opened with one hand.

Figure 17:
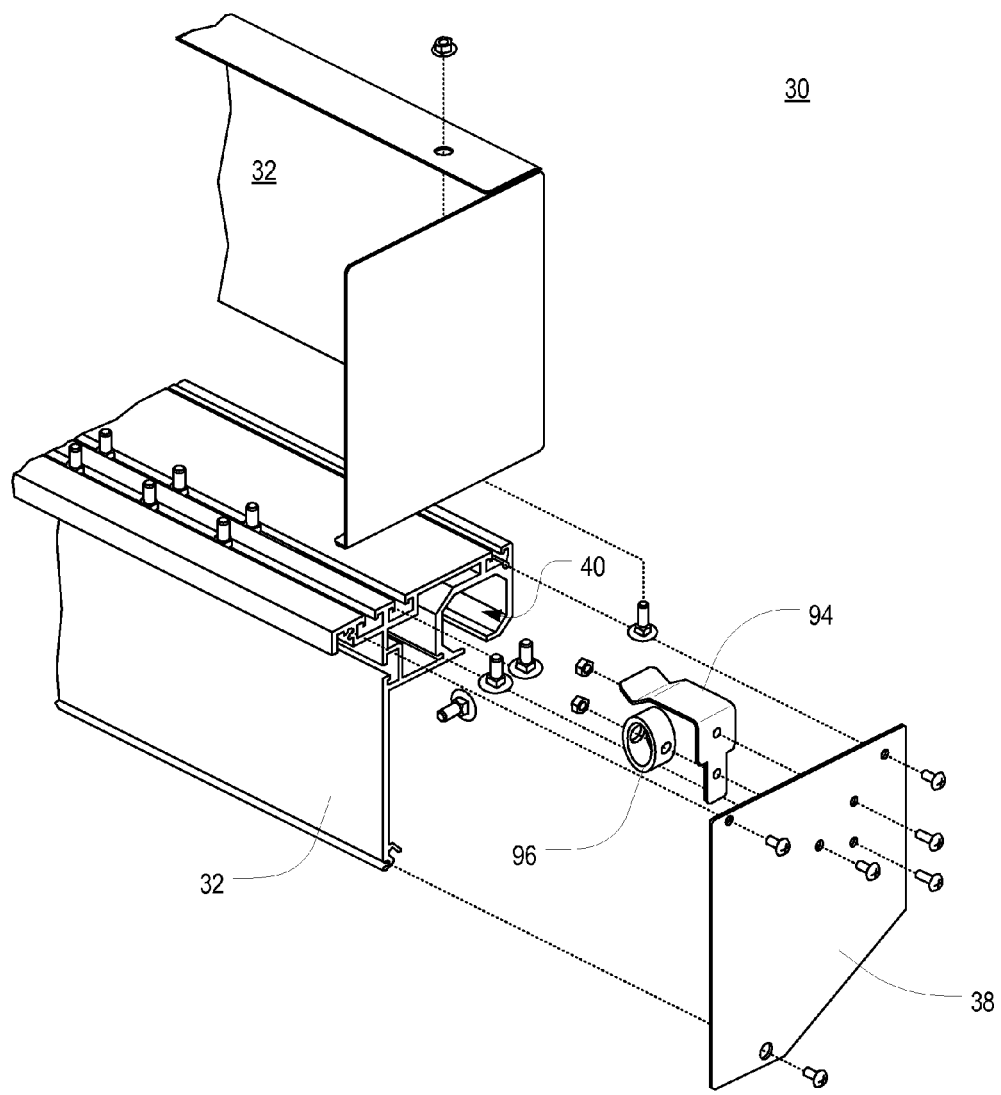
FIG. 17 is an exploded fragmentary rear isometric view of portions of the left end of the rail assembly of FIG. 4.
Figure 18:
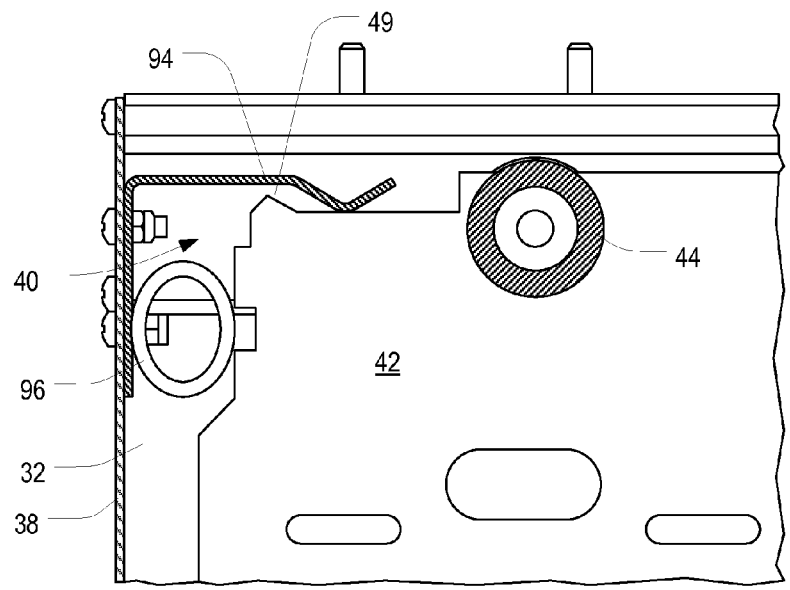
FIGS. 18 and 19 are enlarged fragmentary front cross-sectional views of the rail assembly of FIG. 5, taken along line 18-18.
Figure 19:
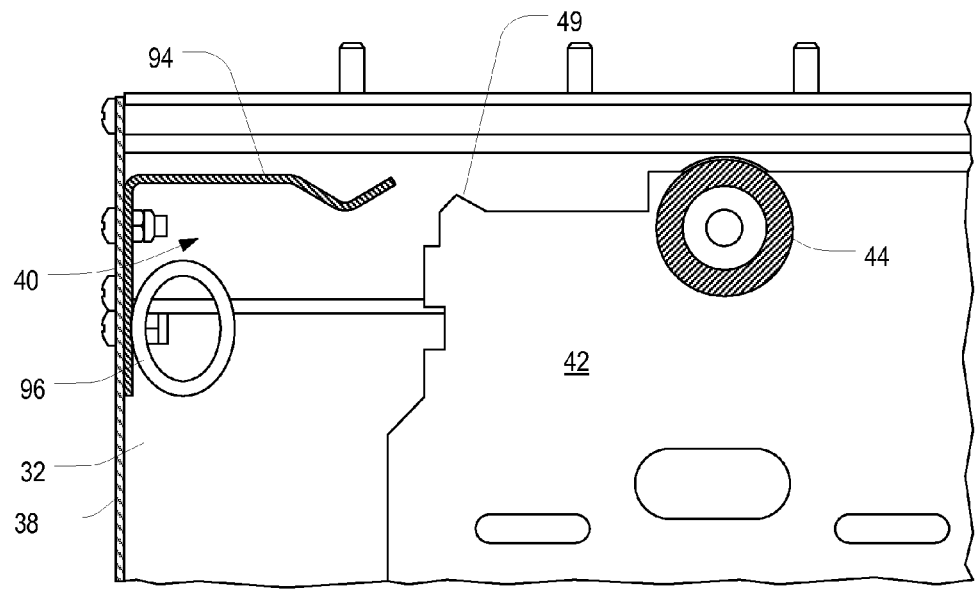

In at least some embodiments, a "hold open" feature may be provided to keep the doors 22 in an open state, if desired. Such a feature may be particularly useful, for example, to allow equipment to be carried in and out of the containment room 10. In this regard, FIG. 17 is an exploded fragmentary rear isometric view of portions of the left end of the rail assembly 30 of FIG. 4, and FIGS. 18 and 19 are enlarged fragmentary front cross-sectional views of the rail assembly 30 of FIG. 5, taken along line 18-18. As shown therein, a spring bracket 94 may be attached to one of the end caps 38 such that it protrudes into the roller cavity 40. When the door 22 closest to the spring bracket 94 is opened to its fullest extent, a raised tooth 49 on the end of the roller bracket 42 carrying that door 22 is pushed past a bend in the spring bracket 94 and is caught behind it, thereby holding the door in its open state. This is shown in FIG. 18. In order to avoid slamming the door 22 against the end cap 38, a bumper 96 may be provided as well. When the door 22 is to be closed again, a gentle tug will be sufficient to pull the trapped tooth 49 from behind the bend in the spring bracket 94, as shown in FIG. 19, and the roller bracket 42 (and the door depending from it) may then operate as described previously.

It will be appreciated that the same principles and elements used for the double door assembly 20 of FIG. 1 may likewise be utilized on the single door assembly 120 shown in FIG. 2, except that only one belt splice (bracket 54 and plate 56) needs to be clamped to the synchronous belt 62 because only one door 22 is utilized. If necessary, the arrangement of the various elements may be reversed, particularly if it is desired to switch from a righthand door to a lefthand door.

Based on the foregoing information, it will be readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention.

Accordingly, while the present invention has been described herein in detail in relation to one or more preferred embodiments, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof.

What is claimed is:

1. A hot/cold aisle air containment room comprising:
a plurality of electronic equipment enclosures at least partially defining an interior aisle;
a frame structure supporting one or more ceiling panels above the interior aisle; and
a door assembly, including:
a sliding door, and
an unpowered door closer mechanism adapted to move the sliding door from an open state to a closed state, thereby providing controlled access to the interior aisle and minimizing intermixing of hot air and cold air between an environment external to the hot/cold aisle air containment room and an environment internal to the hot/cold aisle air containment room;
wherein the hot/cold aisle air containment room is disposed within a room in a building;
wherein the plurality of electronic equipment enclosures are arranged in a row, wherein the interior aisle includes two sides and two ends, and wherein the row of electronic equipment enclosures defines one side of the interior aisle;
wherein the door closer mechanism includes a belt/pulley assembly supported by a rail assembly; and
wherein the belt/pulley assembly includes a damper pulley, a free pulley, and a belt routed around the damper pulley and the free pulley, wherein the sliding door is attached to the belt, thereby allowing the sliding door to be controlled relative to the belt.

2. The hot/cold aisle air containment room of claim 1, wherein the interior aisle is a cold aisle.

3. The hot/cold aisle air containment room of claim 1, wherein the interior aisle is a hot aisle.

4. The hot/cold aisle air containment room of claim 1, further comprising one or more wall panels.

5. The hot/cold aisle air containment room of claim 4, wherein the wall panels at least partially define at least one end or side of the interior aisle.

6. The hot/cold aisle air containment room of claim 1, wherein the belt is a synchronous belt.

7. The hot/cold aisle air containment room of claim 6, wherein the synchronous belt is toothed.

8. The hot/cold aisle air containment room of claim 7, wherein each of the damper pulley and the free pulley include a cylindrical bearing surface having a series of teeth that interlock with the toothed synchronous belt.

9. The hot/cold aisle air containment room of claim 1, further comprising a pulley tensioning device.

10. The hot/cold aisle air containment room of claim 1, wherein the sliding door is attached to the belt via a splice bracket and a belt splice plate.

11. The hot/cold aisle air containment room of claim 1, wherein the door assembly further includes a return spring mounted on a spool to provide resistance to the sliding door.

12. The hot/cold aisle air containment room of claim 11, wherein a biasing force of the return spring is resisted by the damper pulley.

13. The hot/cold aisle air containment room of claim 1, wherein the damper pulley is permitted to rotate freely in one direction and is damped in the other direction.

14. The hot/cold aisle air containment room of claim 1, wherein a spring bracket is attached at one end of the rail assembly, wherein a structure is provided that engages the spring bracket when the sliding door is moved to a fully open state.

15. A hot/cold aisle air containment room comprising:
a plurality of electronic equipment enclosures at least partially defining an interior aisle;
a frame structure supporting one or more ceiling panels above the interior aisle; and
a door assembly, including:
a sliding door, and
an unpowered door closer mechanism adapted to move the sliding door from an open state to a closed state, thereby providing controlled access to the interior aisle and minimizing intermixing of hot air and cold air between an environment external to the hot/cold aisle air containment room and an environment internal to the hot/cold aisle air containment room;
wherein the hot/cold aisle air containment room is disposed within a room in a building;
wherein the plurality of electronic equipment enclosures are arranged in a row, wherein the interior aisle includes two sides and two ends, and wherein the row of electronic equipment enclosures defines one side of the interior aisle;
wherein the door closer mechanism includes a belt/pulley assembly supported by a rail assembly;
wherein the rail assembly includes a main rail extrusion supporting at least one roller bracket assembly; and
wherein each roller bracket assembly includes at least one roller that rides along a portion of the main rail extrusion and that supports a roller bracket which supports the sliding door.

16. The hot/cold aisle air containment room of claim 15, wherein the interior aisle is a cold aisle.

17. The hot/cold aisle air containment room of claim 15, wherein the interior aisle is a hot aisle.

18. The hot/cold aisle air containment room of claim 15, further comprising one or more wall panels.

19. The hot/cold aisle air containment room of claim 18, wherein the wall panels at least partially define at least one end or side of the interior aisle.

20. The hot/cold aisle air containment room of claim 15, wherein a spring bracket is attached at one end of the rail assembly, wherein a structure is provided that engages the spring bracket when the sliding door is moved to a fully open state.

* * * * *